US012439633B2

(12) United States Patent
Xie et al.

(10) Patent No.: US 12,439,633 B2
(45) Date of Patent: Oct. 7, 2025

(54) VTFET WITH CONTROLLED FIN HEIGHT

(71) Applicant: INTERNATIONAL BUSINESS MACHINES CORPORATION, Armonk, NY (US)

(72) Inventors: Ruilong Xie, Niskayuna, NY (US); Chun-Chen Yeh, Danbury, CT (US); Alexander Reznicek, Troy, NY (US); Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 420 days.

(21) Appl. No.: 17/823,799

(22) Filed: Aug. 31, 2022

(65) Prior Publication Data

US 2024/0072164 A1    Feb. 29, 2024

(51) Int. Cl.
*H10D 30/63* (2025.01)
*H10D 30/01* (2025.01)
*H10D 62/13* (2025.01)
*H10D 64/01* (2025.01)

(52) U.S. Cl.
CPC ........... *H10D 30/63* (2025.01); *H10D 30/025* (2025.01); *H10D 62/151* (2025.01); *H10D 64/018* (2025.01)

(58) Field of Classification Search
CPC ............. H01L 29/7827; H01L 29/0847; H01L 29/66553; H01L 29/66666
USPC ........................................................ 257/329
See application file for complete search history.

(56) References Cited

U.S. PATENT DOCUMENTS

| 4,670,768 | A | 6/1987 | Sunami | |
|---|---|---|---|---|
| 8,198,654 | B2* | 6/2012 | Masuoka | ........... H10D 84/0195 257/206 |
| 8,610,202 | B2* | 12/2013 | Masuoka | ............... H10D 86/01 257/329 |
| 9,780,197 | B1 | 10/2017 | Xie | |
| 10,141,446 | B2 | 11/2018 | Niimi | |
| 10,157,798 | B1 | 12/2018 | Chi | |
| 10,249,731 | B1 | 4/2019 | Li | |
| 10,297,507 | B2 | 5/2019 | Cheng | |
| 10,680,082 | B2 | 6/2020 | Yamashita | |
| 10,804,268 | B2 | 10/2020 | Chiang | |
| 10,910,494 | B2 | 2/2021 | Cheng | |
| 11,038,042 | B2 | 6/2021 | Loubet | |
| 2011/0062521 | A1* | 3/2011 | Masuoka | ........... H10D 84/0195 257/350 |
| 2012/0319201 | A1* | 12/2012 | Sun | ........................ H10B 10/12 257/338 |
| 2014/0103408 | A1* | 4/2014 | Masuoka | ............... H10F 39/024 257/290 |
| 2016/0344389 | A1* | 11/2016 | Masuoka | ............. H10D 64/512 |

(Continued)

*Primary Examiner* — Mohammad M Hoque
(74) *Attorney, Agent, or Firm* — Jeffrey M. Ingalls

(57) ABSTRACT

A semiconductor device includes: a vertical transport field-effect transistor (VTFET) device including a bottom source/drain (S/D) epitaxial layer, a vertical fin channel formed on the bottom S/D epitaxial layer, and a top S/D epitaxial layer formed on the vertical fin channel. The bottom S/D epitaxial layer has an asymmetric profile in cross-section where a first side of the vertical fin channel is aligned with a first side of the bottom S/D epitaxial layer, and the bottom S/D epitaxial layer has a stepped profile that extends beyond a second edge of the vertical fin channel.

20 Claims, 18 Drawing Sheets

(56) References Cited

U.S. PATENT DOCUMENTS

2021/0358754 A1\* 11/2021 Masuoka ........... H10D 84/0195
2023/0145678 A1\* 5/2023 Shirota .................. H10B 12/33
                                                                                    365/129

\* cited by examiner

VTFET WITH CONTROLLED FIN HEIGHT

BACKGROUND

The present disclosure relates to semiconductor devices. In particular, the present disclosure relates to fabrication methods and resulting structures enabling fin height control for vertical transport field-effect transistors (VTFETs).

Fin field-effect transistor (FinFET) devices include a transistor architecture that uses raised source-to-drain channel regions, referred to as fins. Known FinFET devices include fins with source/drain regions on lateral sides of the fins, so that current flows in a horizontal direction (e.g., parallel to a substrate) between source/drain regions at opposite ends of the fins in the horizontal direction.

VTFETs are becoming viable device options for smaller scale semiconductor devices, such as, for example, devices beyond the 5 nanometer (nm) node. VTFET devices include fin channels with source/drain regions at ends of the fin channels on top and bottom sides of the fins. Current runs through the fin channels in a vertical direction (e.g., perpendicular to a substrate), for example, from a bottom source/drain region to a top source/drain region.

Vertical transport architecture devices are designed to address the limitations of horizontal device architectures by, for example, decoupling gate length from the contact gate pitch, providing a FinFET-equivalent density at a larger contacted poly pitch (CPP), and providing lower MOL resistance.

VTFET devices provides viable solutions for transistor scaling. With current flowing in the vertical direction, the gate length and source/drain dimension are not limited by the lateral scaling.

SUMMARY

Embodiments of the present disclosure relate to a semiconductor device. The semiconductor device includes a vertical transport field-effect transistor (VTFET) device including a bottom source/drain (S/D) epitaxial layer, a vertical fin channel formed on the bottom S/D epitaxial layer, and a top S/D epitaxial layer formed on the vertical fin channel. The bottom S/D epitaxial layer has an asymmetric profile in cross-section where a first side of the vertical fin channel is aligned with a first side of the bottom S/D epitaxial layer, and the bottom S/D epitaxial layer has a stepped profile that extends beyond a second edge of the vertical fin channel.

Other embodiments relate to a method of fabricating a semiconductor device. The method includes forming a vertical transport field-effect transistor (VTFET) device including forming a bottom source/drain (S/D) epitaxial layer, forming a vertical fin channel on the bottom S/D epitaxial layer, and forming a top S/D epitaxial layer on the vertical fin channel, wherein the bottom S/D epitaxial layer has an asymmetric profile in cross-section where a first side of the vertical fin channel is aligned with a first side of the bottom S/D epitaxial layer, and the bottom S/D epitaxial layer has a stepped profile that extends beyond a second edge of the vertical fin channel.

The above summary is not intended to describe each illustrated embodiment or every implementation of the present disclosure.

BRIEF DESCRIPTION OF THE DRAWINGS

The drawings included in the present application are incorporated into, and form part of the specification. They illustrate embodiments of the present disclosure and, along with the description, explain the principles of the disclosure. The drawings are only illustrative of certain embodiments and do not limit the disclosure.

DETAILED DESCRIPTION

Figure 1:
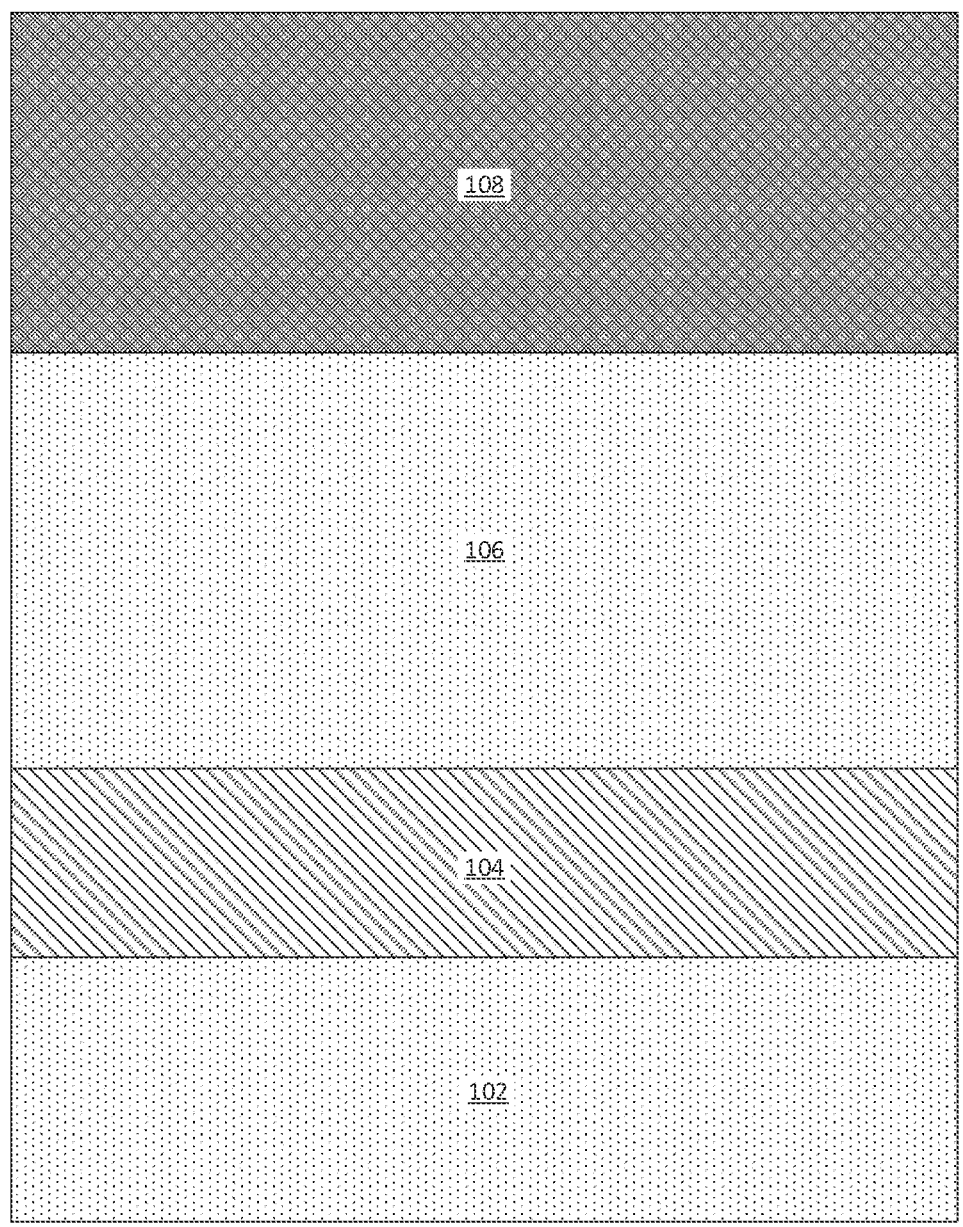
FIG. 1 is a cross-sectional view of a VTFET semiconductor device at an intermediate stage of the manufacturing process, according to embodiments.

Exemplary embodiments will now be discussed in further detail with regard to semiconductor devices and methods of manufacturing same and, in particular, to VTFET devices having precise fin height control.

It is to be understood that the various layers and/or regions shown in the accompanying drawings are not drawn to scale, and that one or more layers and/or regions of a type commonly used in, for example, FinFET, VTFET, CMOS, field-effect transistor (FET), nanowire FET, nanosheet FETs, metal-oxide-semiconductor field-effect transistor (MOSFET), single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present embodiments can be employed in applications, hardware, and/or electronic systems. Suitable hardware and systems for implementing embodiments may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments. Given the teachings of the embodiments provided herein, one of ordinary skill in the art will be able to contemplate other implementations and applications of the embodiments.

The present embodiments may be used in connection with semiconductor devices that may require, for example, FinFETs, VTFETs, CMOS s, FETs, nanowire FETs, nanosheet FETs, SETs, and/or MOSFETs. By way of non-limiting example, the semiconductor devices can include, but are not necessarily limited to FinFET, VTFET, CMOS, FET, nanowire FET, nanosheet FET, SET, CMOS and MOSFET devices, and/or semiconductor devices that use FinFET, VTFET, CMOS, FET, nanowire FET, nanosheet FET, SET, CMOS and/or MOSFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit ("IC") fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping, and patterning/lithography.

Deposition is any process that grows, coats, or otherwise transfers a material onto the wafer. Available technologies include physical vapor deposition ("PVD"), chemical vapor deposition ("CVD"), electrochemical deposition ("ECD"), molecular beam epitaxy ("MBE") and more recently, atomic layer deposition ("ALD") among others. Another deposition technology is plasma-enhanced chemical vapor deposition ("PECVD"), which is a process that uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etching processes (either wet or dry), chemical-mechanical planarization ("CMP"), and the like. One example of a removal process is ion beam etching ("IBE"). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching ("RIE"). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light-sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the present disclosure, in certain VTFET devices, the fin height is defined by the etch depth, and there may be no hard stop to enable precise control of the fin height. Moreover, a junction may be defined by a sigma etching process in addition to diffusion, and it may be challenging to form a sharp junction. In particular, in certain VTFET devices, the manufacturing process relies on a sigma FIN recess and epitaxial growth to define the bottom junction. However, the junction may not be located directly under the channel, and the process may need an increased amount of diffusion. Therefore, there may not be an abrupt junction.

However, the present embodiments provide semiconductor devices and methods of manufacturing semiconductor devices while enable an accurate fin height in addition to directly locating the bottom epitaxial layer under the channel. In the present embodiments, the VTFET fin height is defined by the initial epitaxial layer height leading to accurate height control of the fin. Also, the VTFET bottom junction is located directly under the channel allowing for the formation of an abrupt junction leading to improved resistance of the VTFET device.

Referring now to the drawings in which like numerals represent the same or similar elements and initially to FIG. 1, an exemplary method of manufacturing a semiconductor device 100 that is a VTFET device is shown. As shown in FIG. 1, a substrate 102 is provided. The substrate 102 may include a semiconductor material including, but not limited to, silicon (Si), silicon germanium (SiGe), silicon carbide (SiC), Si:C (carbon doped silicon), silicon germanium carbide (SiGeC), carbon doped silicon germanium (SiGe:C), III-V, II-V compound semiconductor or other like semiconductor. In addition, multiple layers of the semiconductor materials can be used as the semiconductor material of the substrate. The semiconductor substrate 102 can be a bulk substrate or a semiconductor-on-insulator substrate such as, but not limited to, a silicon-on-insulator (all), silicon-germanium-on-insulator (SGOI) or III-V-on-insulator substrate including a buried insulating layer, such as, for example, a buried oxide, nitride layer or aluminum oxide.

As shown in FIG. 1, a sacrificial layer 104 is epitaxially formed on the substrate 102. According to an embodiment, the sacrificial layer 104 comprises SiGe. However, it should be appreciated that other suitable materials may be used for the sacrificial layer 104. Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RT-CVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 400° C. to 900° C. Although higher temperature typically results in faster deposition, the faster deposition may result in crystal defects and film cracking.

As also shown in FIG. 1, a fin 106 layer is epitaxially formed on the sacrificial layer 104. Because this fin 106 is grown by an epitaxial process the height can be accurately controlled. A hardmask 108 is then formed on the fin 106. It should be appreciated that any suitable epitaxial growth process may be used to form the fin 106 layer. In certain examples, the fin 106 is a semiconductor layer including Si.

Figure 2:
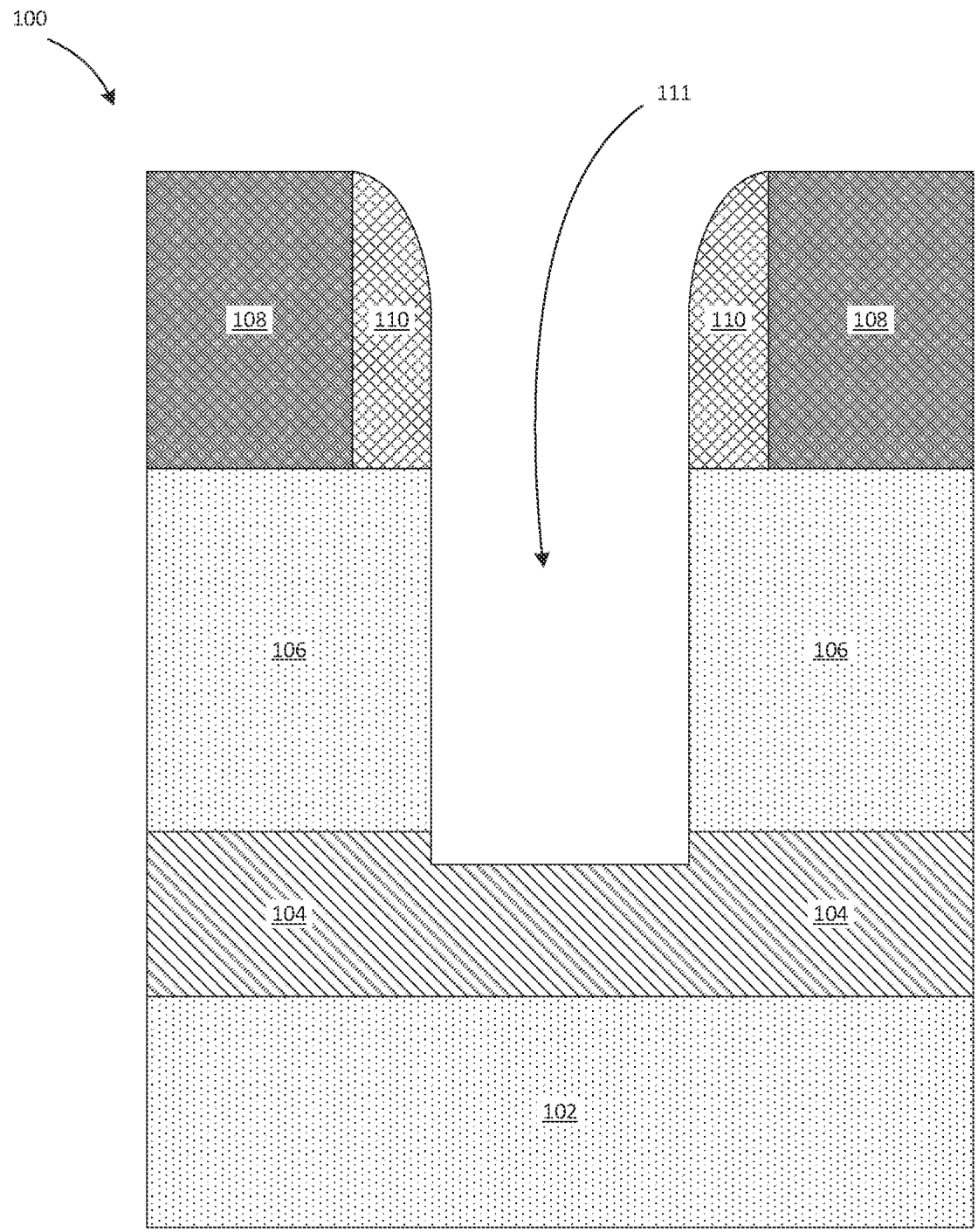
FIG. 2 is a cross-sectional view of the VTFET semiconductor device of FIG. 1 after additional fabrication operations, according to embodiments.

Referring now to FIG. 2, this figure is a cross-sectional view of the VTFET semiconductor device 100 of FIG. 1 after additional fabrication operations, according to embodiments. As shown in FIG. 2, the hardmask 108 is first patterned to create an opening in the hardmask 108, thereby exposing portions of the fin 106 layer. Then, in the opening formed in the hardmask 108, an inner spacer 110 is formed on the sidewalls of the hardmask 108 and on the fin 106 layer. Then, using the hardmask 108 and the inner spacer 110 as a mask, a trench 111 is formed by etching through the fin 106 layer and through at least a portion of the sacrificial layer 104. However, even if there are any nonuniformities in the etching depth (i.e., due to, for example, an RIE material removal process removing more or less of the sacrificial layer 104), the height of the fin 106 remains the same.

Figure 3:
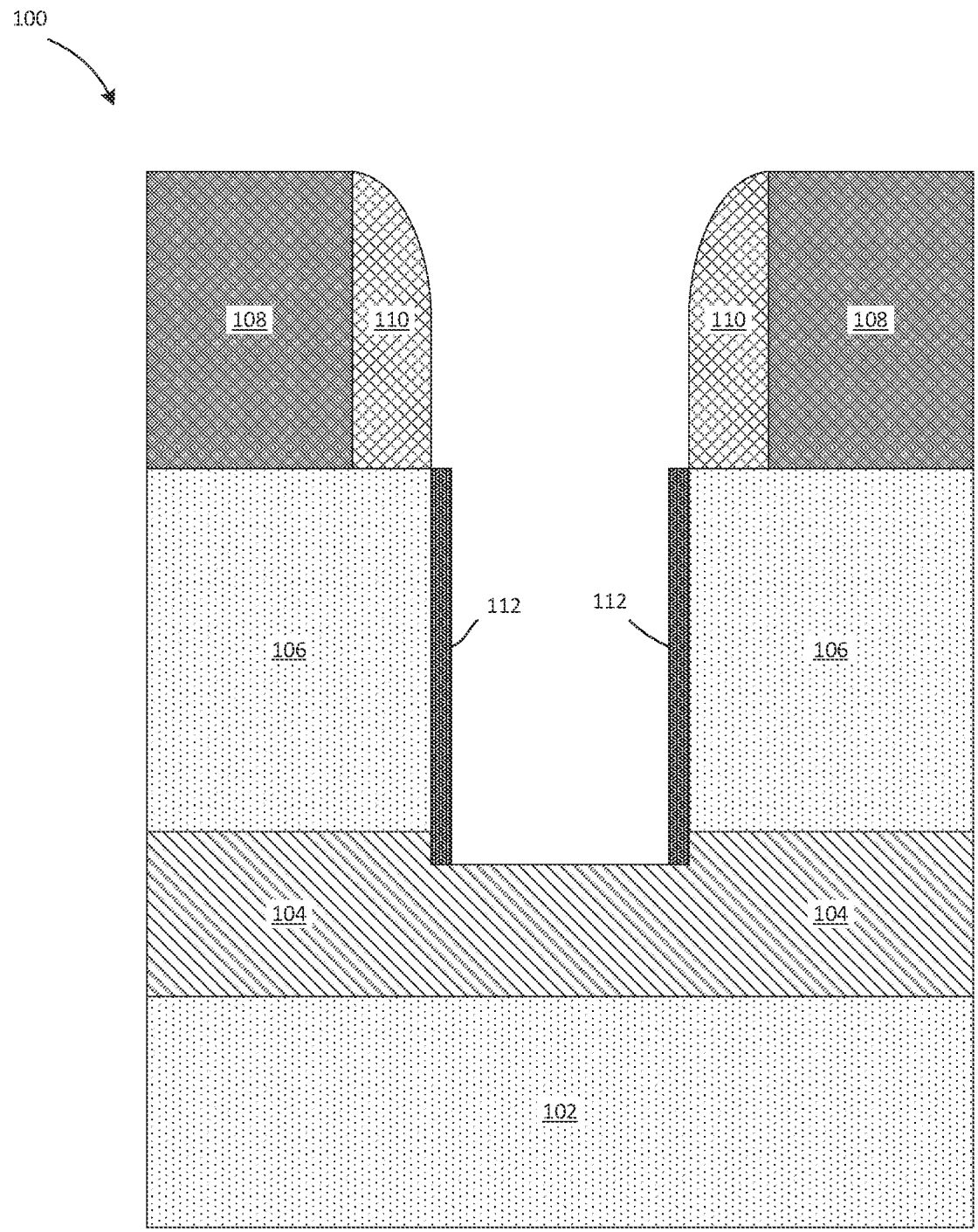
FIG. 3 is a cross-sectional view of the VTFET semiconductor device of FIG. 2 after additional fabrication operations, according to embodiments.

Referring now to FIG. 3, this figure is a cross-sectional view of the VTFET semiconductor device 100 of FIG. 2 after additional fabrication operations, according to embodiments. As shown in FIG. 3, a sacrificial protective spacer 112 is formed on the sidewalls of the fin 106 and the sidewalls of the sacrificial layer 104 (i.e., to the extent that the RIE process has exposed a portion of the sidewalls of the sacrificial layer 104).

Figure 4:
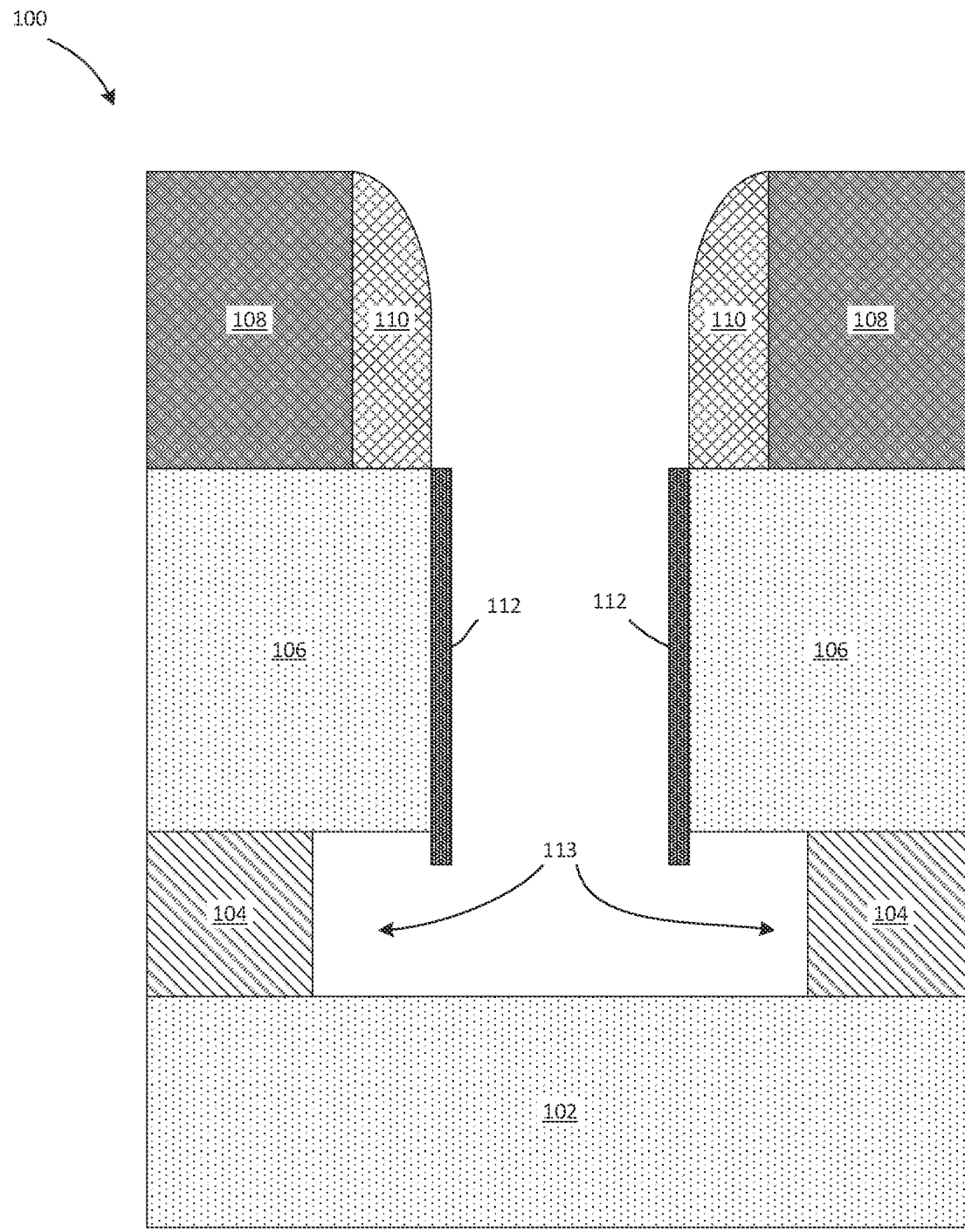
FIG. 4 is a cross-sectional view of the VTFET semiconductor device of FIG. 3 after additional fabrication operations, according to embodiments.

Referring now to FIG. 4, this figure is a cross-sectional view of the VTFET semiconductor device 100 of FIG. 3 after additional fabrication operations, according to embodiments. As shown in FIG. 4, a portion of the SiGe material of the sacrificial layer 104 is removed with any suitable material removal process known to one of skill in the art. Thus, indentations 113 are formed in the sacrificial layer 104. This exposes a portion of the underside of the fin 106, and these exposed portions of the fin 106 serve as nucleation sites for future epitaxial growth.

Figure 5:
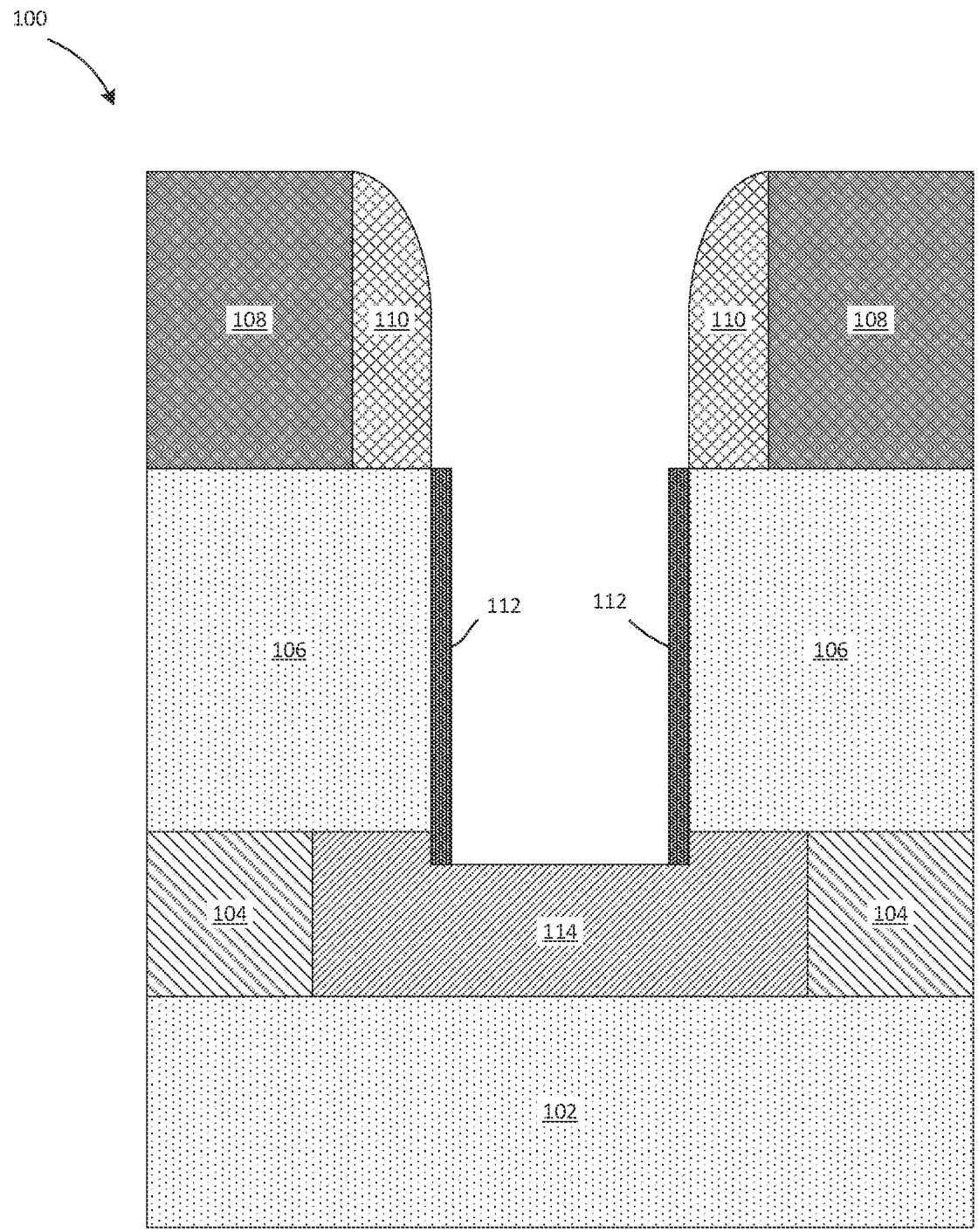
FIG. 5 is a cross-sectional view of the VTFET semiconductor device of FIG. 4 after additional fabrication operations, according to embodiments.

Referring now to FIG. 5, this figure is a cross-sectional view of the VTFET semiconductor device 100 of FIG. 4 after additional fabrication operations, according to embodiments. As shown in FIG. 5, the open portion of the sacrificial layer 104 that was removed by the process described above with respect to FIG. 4 is filled in with an epitaxial layer 114 using the exposed underside of the fin 106 as a nucleation site to begin the epitaxial growth. As shown in FIG. 5, the epitaxial layer 114 (or bottom S/D epitaxial layer) fills in the indentations 113 and is grown to a height generally corresponding to the bottom of the sacrificial protective spacer 112. Because the bottom portion of the sacrificial protective spacer 112 extends below the bottom surface of the fin 106, the resulting epitaxial layer 114 has a stepped configuration with a central portion thereof having a height that is somewhat less than side portions thereof. The epitaxial layer 114 serves as a bottom source/drain region of the VTFET, and it can be doped depends on the type of transistors. For example, a p-type doping material such as boron may be used for the PFET, and an n-type doping material such as phosphorous may be used for the NFET.

Figure 6:
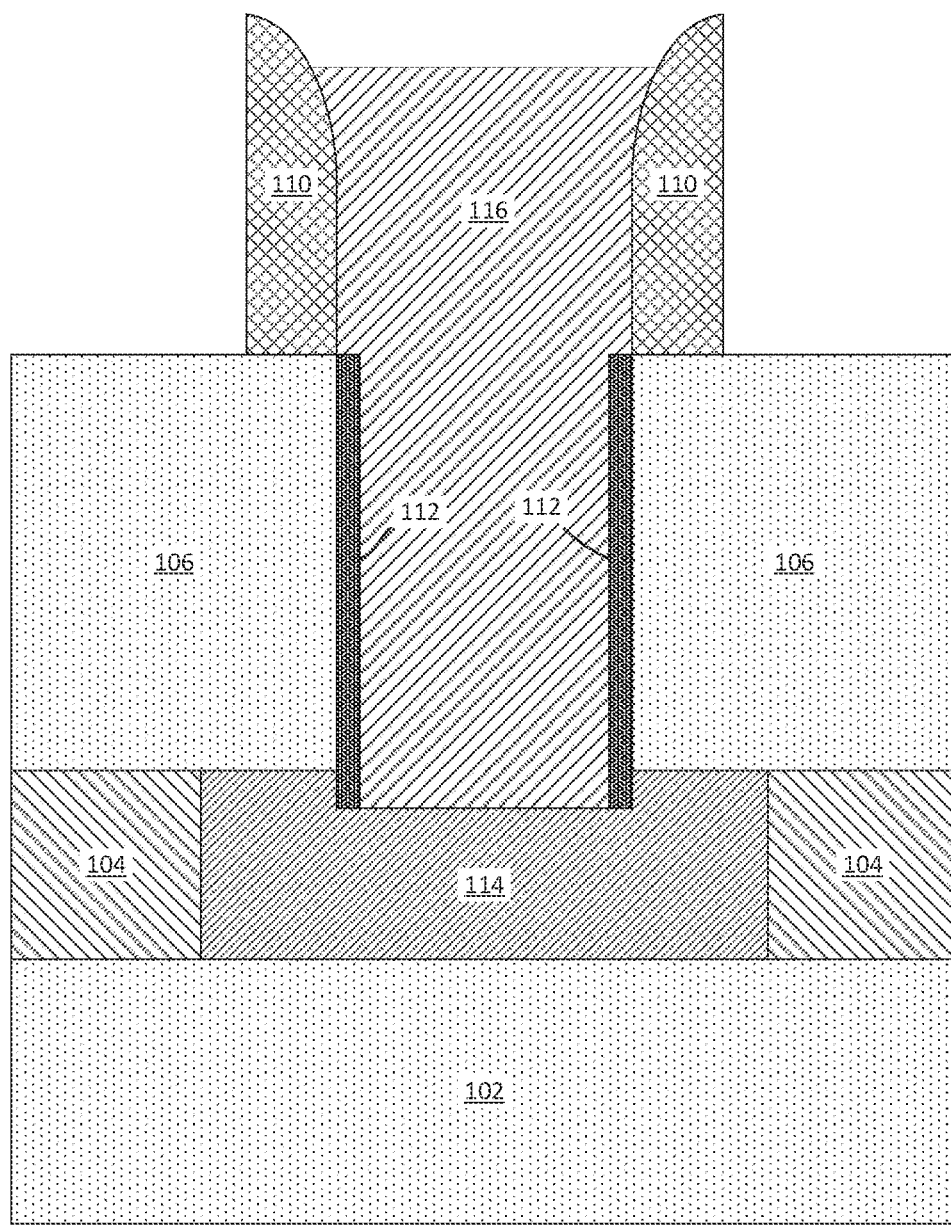
FIG. 6 is a cross-sectional view of the VTFET semiconductor device of FIG. 5 after additional fabrication operations, according to embodiments.

Referring now to FIG. 6, this figure is a cross-sectional view of the VTFET semiconductor device 100 of FIG. 5 after additional fabrication operations, according to embodiments. As shown in FIG. 6, an organic planarization (OPL) layer 116 is formed between the fins 106. The OPL layer 116 may include any suitable insulating OPL material(s). In certain examples, as shown in FIG. 6, the OPL layer 116 is recessed at or below an upper portion of the inner spacer 110. Although not shown in FIG. 6, this recessing of the OPL layer 116 exposes the hardmask 108 which is subsequently removed with any suitable material removal process. Thus, the remaining inner spacers 110 and the OPL layer 116 function as a mask for further processing of the fins 106.

Figure 7:
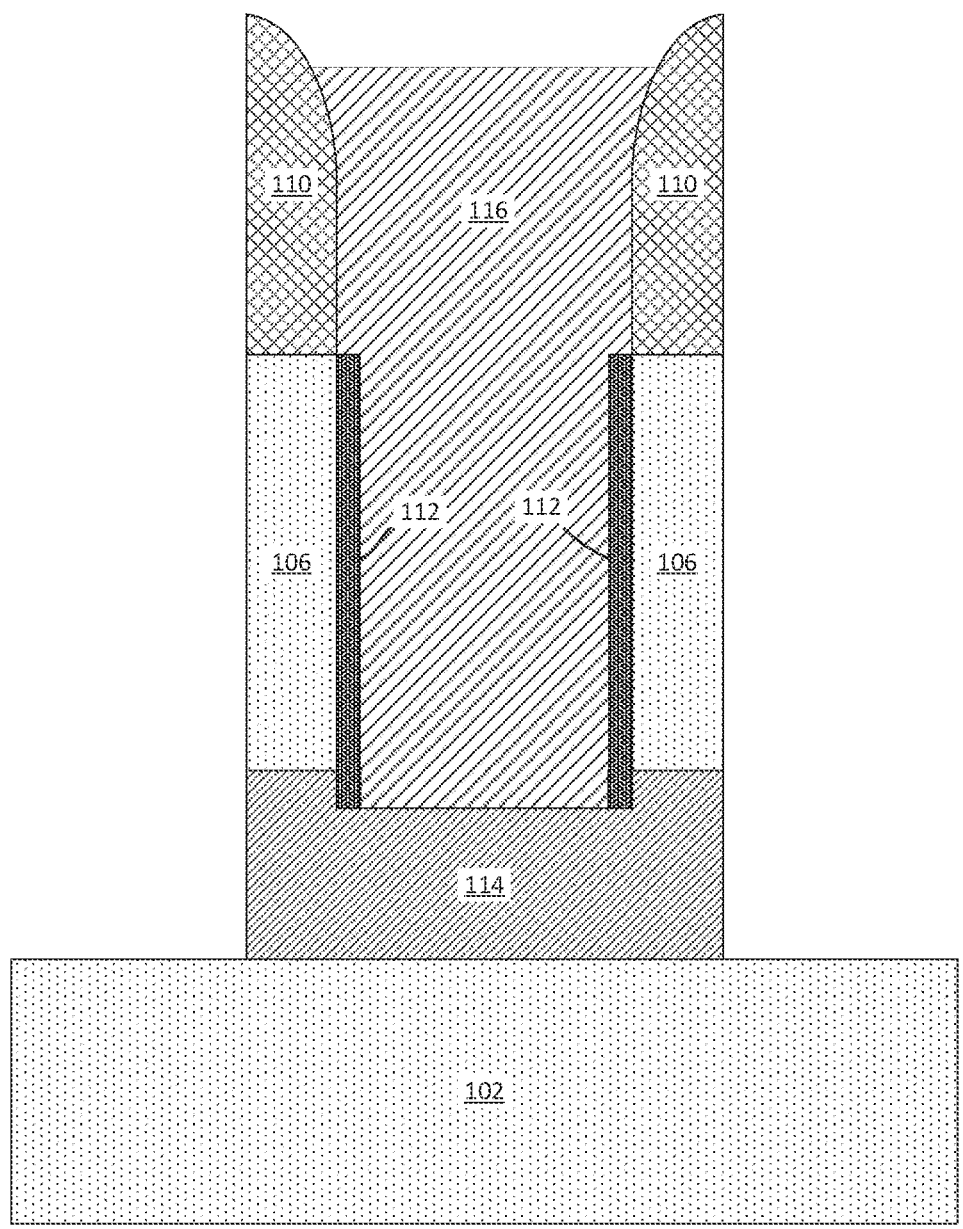
FIG. 7 is a cross-sectional view of the VTFET semiconductor device of FIG. 6 after additional fabrication operations, according to embodiments.

Referring now to FIG. 7, this figure is a cross-sectional view of the VTFET semiconductor device 100 of FIG. 6 after additional fabrication operations, according to embodiments. As shown in FIG. 7, a material removal process (e.g., RIE) is performed on the semiconductor device 100 using the inner spacers 110 and the OPL layer 116 as a mask. The material of the fins 106, the sacrificial layer 104 and portions of the epitaxial layer 114 are removed in areas not covered by the inner spacers 110 and the OPL layer 116. Thus, as shown in FIG. 7, in this embodiment, all portions of the sacrificial layer 104 have been removed at this stage of the manufacturing process. Moreover, it can be seen that the width of the resulting fins 106 corresponds generally to the width of the inner spacers 110. Moreover, as mentioned above, the height of the fins 106 remains the same as when the original fin 106 layer was formed by an epitaxial process.

Figure 8:
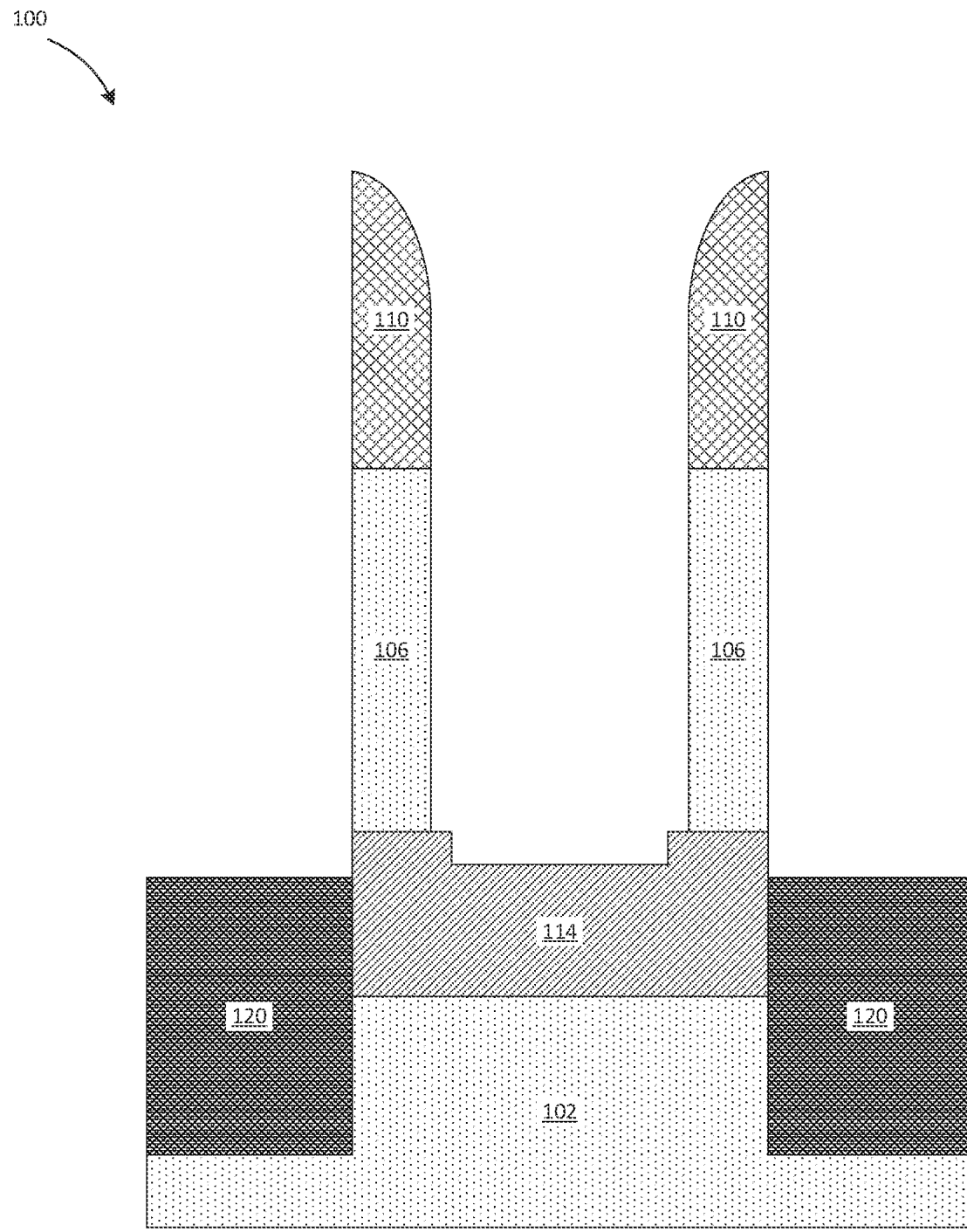
FIG. 8 is a cross-sectional view of the VTFET semiconductor device of FIG. 7 after additional fabrication operations, according to embodiments.

Referring now to FIG. 8, this figure is a cross-sectional view of the VTFET semiconductor device 100 of FIG. 7 after additional fabrication operations, according to embodiments. As shown in FIG. 8, the OPL layer 116 is removed. The sacrificial protective spacers 112 are also removed. As also shown in FIG. 8, the semiconductor device 100 also includes isolation regions 120 (e.g., shallow trench isolation (STI) regions) formed in recessed portions of the substrate 102. The isolation regions 120 include dielectric material, such as, but not necessarily limited to, $SiO_x$, SiOC, SiOCN or some other suitable dielectric material. Shallow trench isolation (STI), also known as box isolation technique, is an integrated circuit feature which prevents electric current leakage between adjacent semiconductor device components. STI is generally used on complementary metal-oxide-semiconductor (CMOS) process technology nodes of 250 nanometers and smaller. In general, STI regions are created early during the semiconductor device fabrication process, before transistors are formed. The key steps of the STI process involve etching a pattern of trenches in the silicon, depositing one or more dielectric materials (such as silicon dioxide) to fill the trenches, and removing the excess dielectric using a technique such as chemical-mechanical planarization.

Thus, in the present embodiment as shown and described above with respect to FIGS. 1-8, the fin 106 height (i.e., due to the original formation of the fin 106 by the epitaxial process) and the fin 106 width (i.e., due to the controlled width of the inner spacer 110) are accurate. Moreover, the location of the epitaxial layer 114 is controlled to be directly under the channel region of the fins 106 and extends continuously between the fins 106 (or vertical fin channels) and contacts both the vertical fin channels. Moreover, the epitaxial layer 114 has an asymmetric kink (or stepped profile in cross-section) which faces toward the inner sides of the two fins 106, and the epitaxial layer 114 contacts both of the adjacent fins 106.

Figure 9:
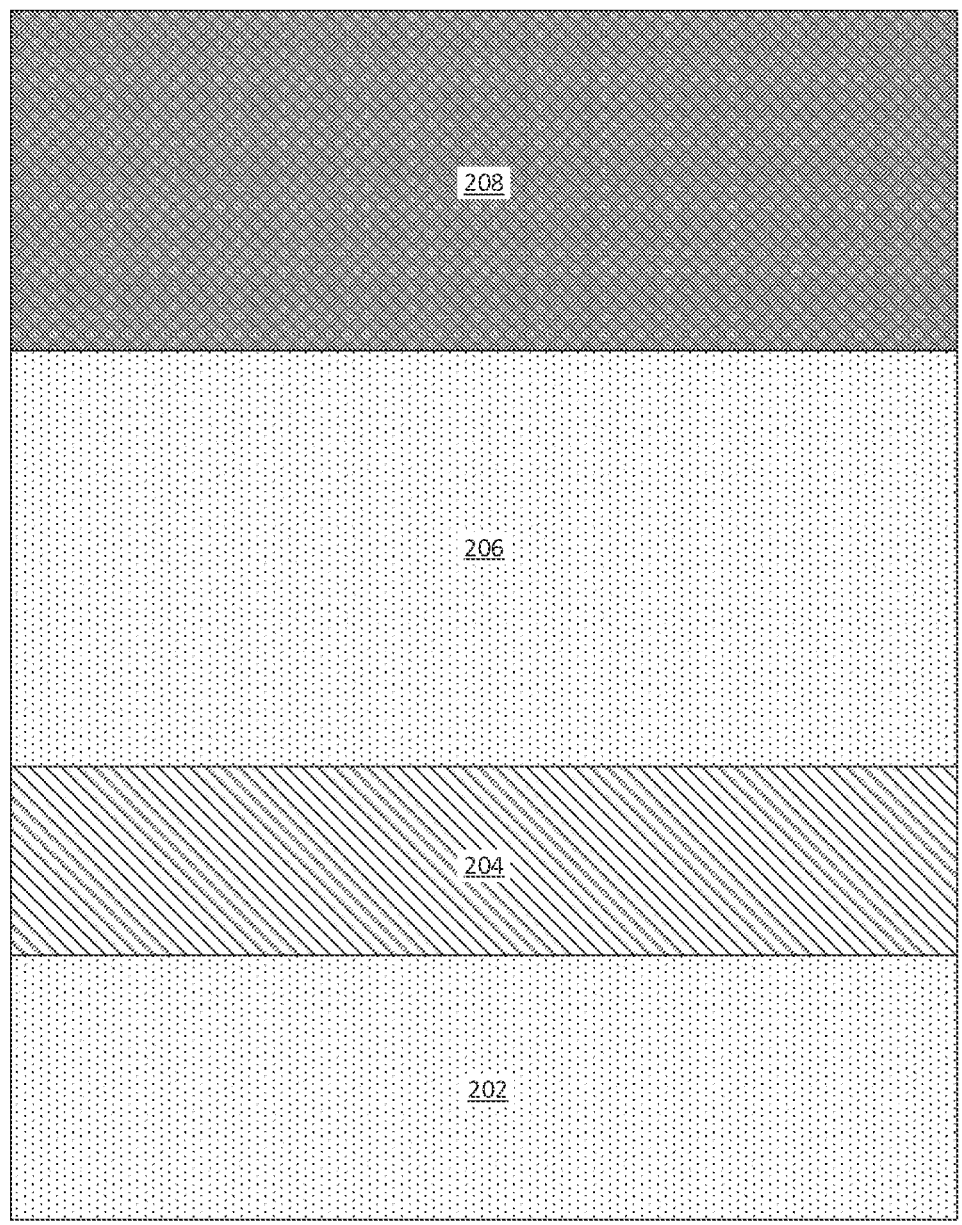
FIG. 9 is a cross-sectional view of a semiconductor device at an intermediate stage of the manufacturing process, according to embodiments, according to embodiments.

Referring now to FIG. 9, an exemplary method of manufacturing a semiconductor device 200 that is a VTFET device is shown. As shown in FIG. 9, a substrate 202 is provided. The substrate 202 may include a semiconductor material including, but not limited to, silicon (Si), silicon germanium (SiGe), silicon carbide (SiC), Si:C (carbon doped silicon), silicon germanium carbide (SiGeC), carbon doped silicon germanium (SiGe:C), III-V, II-V compound semiconductor or other like semiconductor. In addition, multiple layers of the semiconductor materials can be used as the semiconductor material of the substrate 202. The semiconductor substrate 202 can be a bulk substrate or a semiconductor-on-insulator substrate such as, but not limited to, a silicon-on-insulator (all), silicon-germanium-on-insulator (SGOI) or III-V-on-insulator substrate including a buried insulating layer, such as, for example, a buried oxide, nitride layer or aluminum oxide.

As shown in FIG. 9, a sacrificial layer 204 is epitaxially formed on the substrate 202. According to an embodiment, the sacrificial layer 204 comprises SiGe. However, it should be appreciated that other suitable materials may be used for the sacrificial layer 204. Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RT-CVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 400° C. to 900° C. Although higher temperature typically results in faster deposition, the faster deposition may result in crystal defects and film cracking.

As also shown in FIG. 9, a fin 206 layer is epitaxially formed on the sacrificial layer 204. Because this fin 206 is grown by an epitaxial process the height can be accurately controlled. A hardmask 208 is then formed on the fin 206. It should be appreciated that any suitable epitaxial growth process may be used to form the fin 206 layer. In certain examples, the fin 206 is a semiconductor layer including Si.

Figure 10:
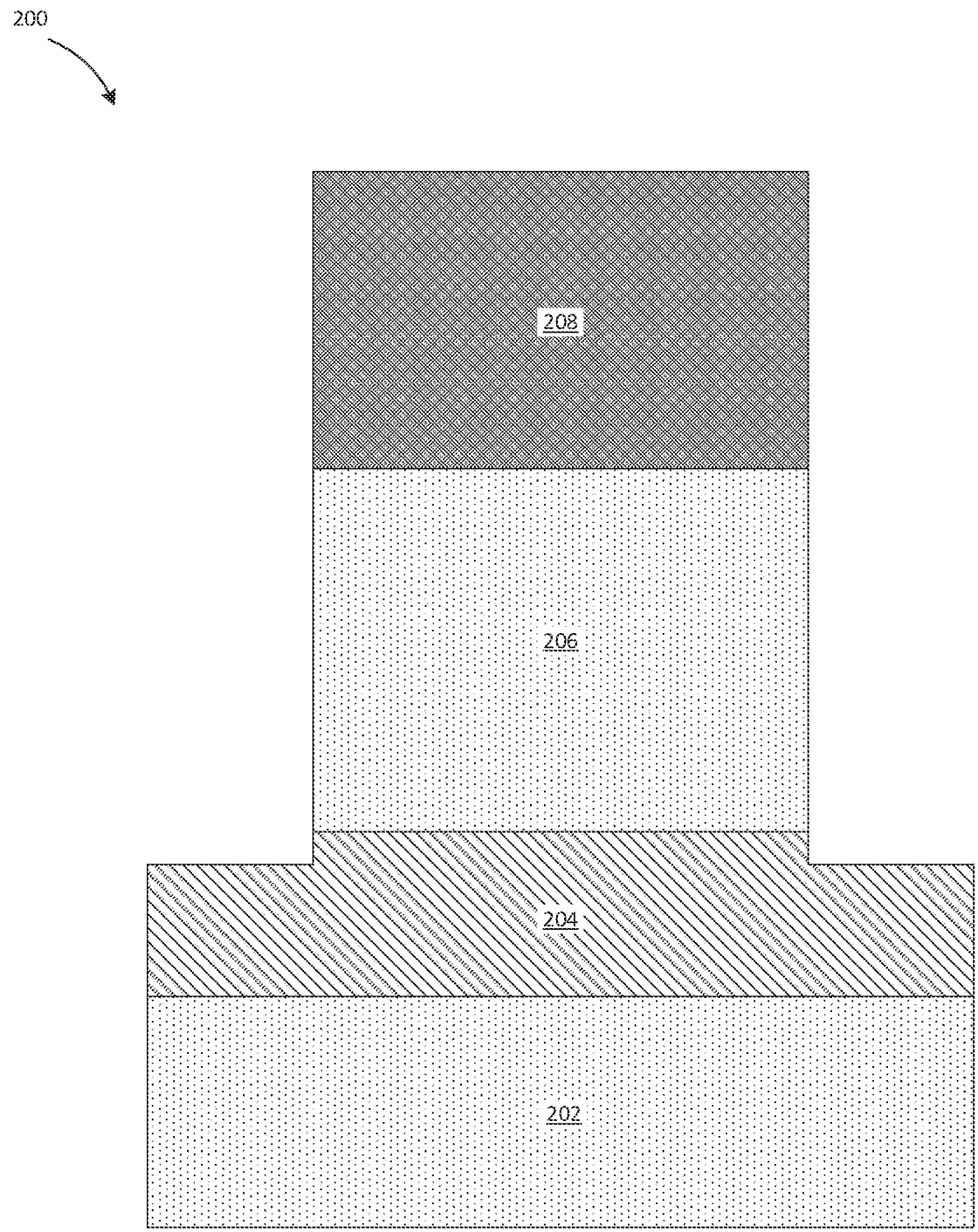
FIG. 10 is a cross-sectional view of the VTFET semiconductor device of FIG. 9 after additional fabrication operations, according to embodiments.

Referring now to FIG. 10, this figure is a cross-sectional view of the VTFET semiconductor device 200 of FIG. 9 after additional fabrication operations, according to embodiments. As shown in FIG. 10, the hardmask 208 is first patterned to create openings in the hardmask 208, thereby exposing portions of the fin 206 layer. Then, using the hardmask 208 as a mask, a wide fin 206 is formed by etching through the fin 206 and through at least a portion of the sacrificial layer 204 (i.e., on both sides of the resulting fin 106). However, even if there are any nonuniformities in the etching depth (i.e., due to, for example, an RIE material removal process removing more or less of the sacrificial layer 204), the height of the fin 206 remains the same. Thus, in contrast to the embodiment described above with FIGS. 1-8, in this embodiment, an inner trench 111 is not formed in the middle of two separate fins 106 (i.e., forming inner sidewalls of the fins 106), but rather the outer sidewalls of the fins 206 are first exposed.

Figure 11:
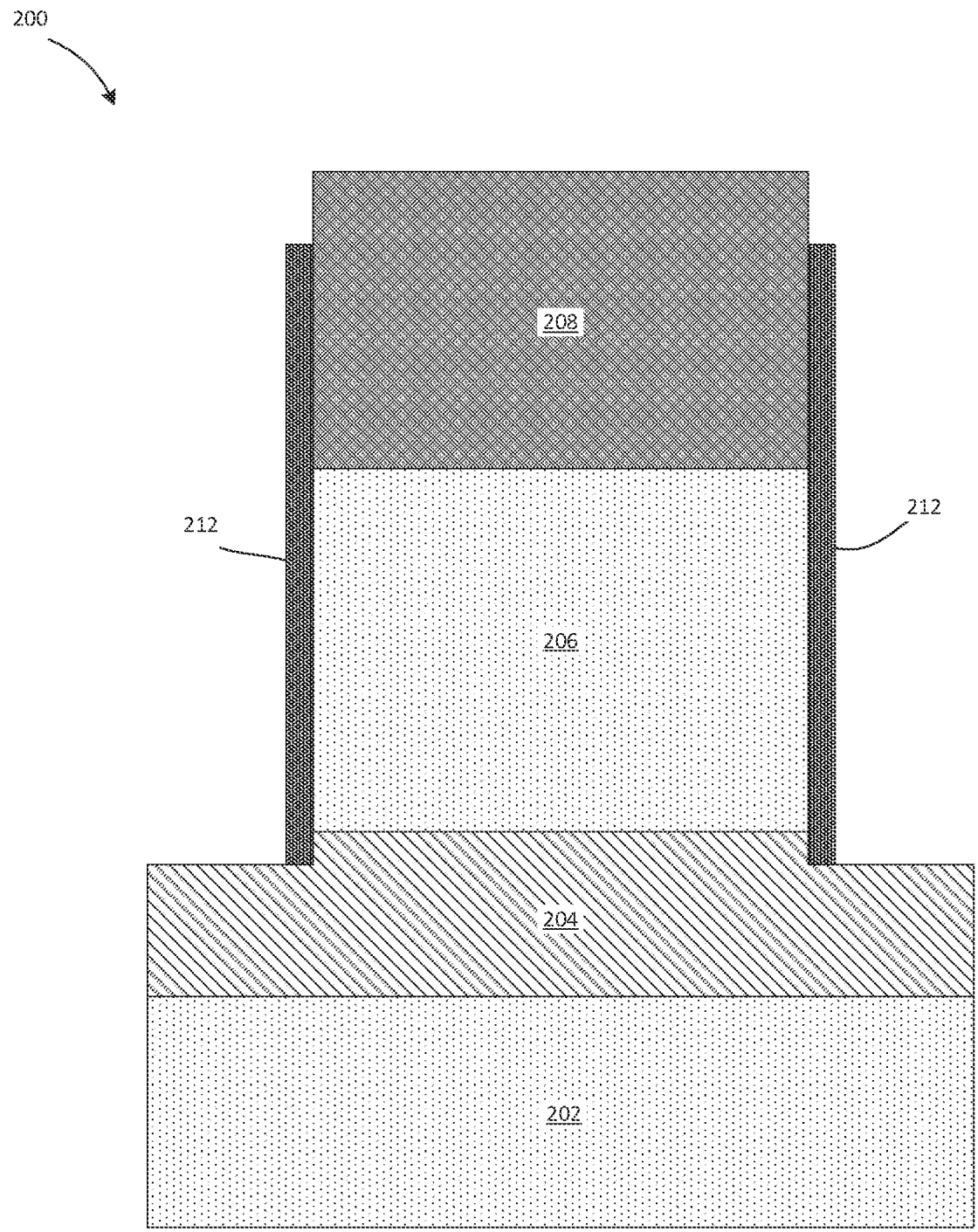
FIG. 11 is a cross-sectional view of the VTFET semiconductor device of FIG. 10 after additional fabrication operations, according to embodiments.

Referring now to FIG. 11, this figure is a cross-sectional view of the VTFET semiconductor device 200 of FIG. 10 after additional fabrication operations, according to embodiments. As shown in FIG. 11, a sacrificial protective spacer 212 is formed on the sidewalls of the fin 206, the sidewalls of the hardmask 208, and the sidewalls of the sacrificial layer 204 (i.e., to the extent that the RIE process has exposed a portion of the sidewalls of the sacrificial layer 204).

Figure 12:
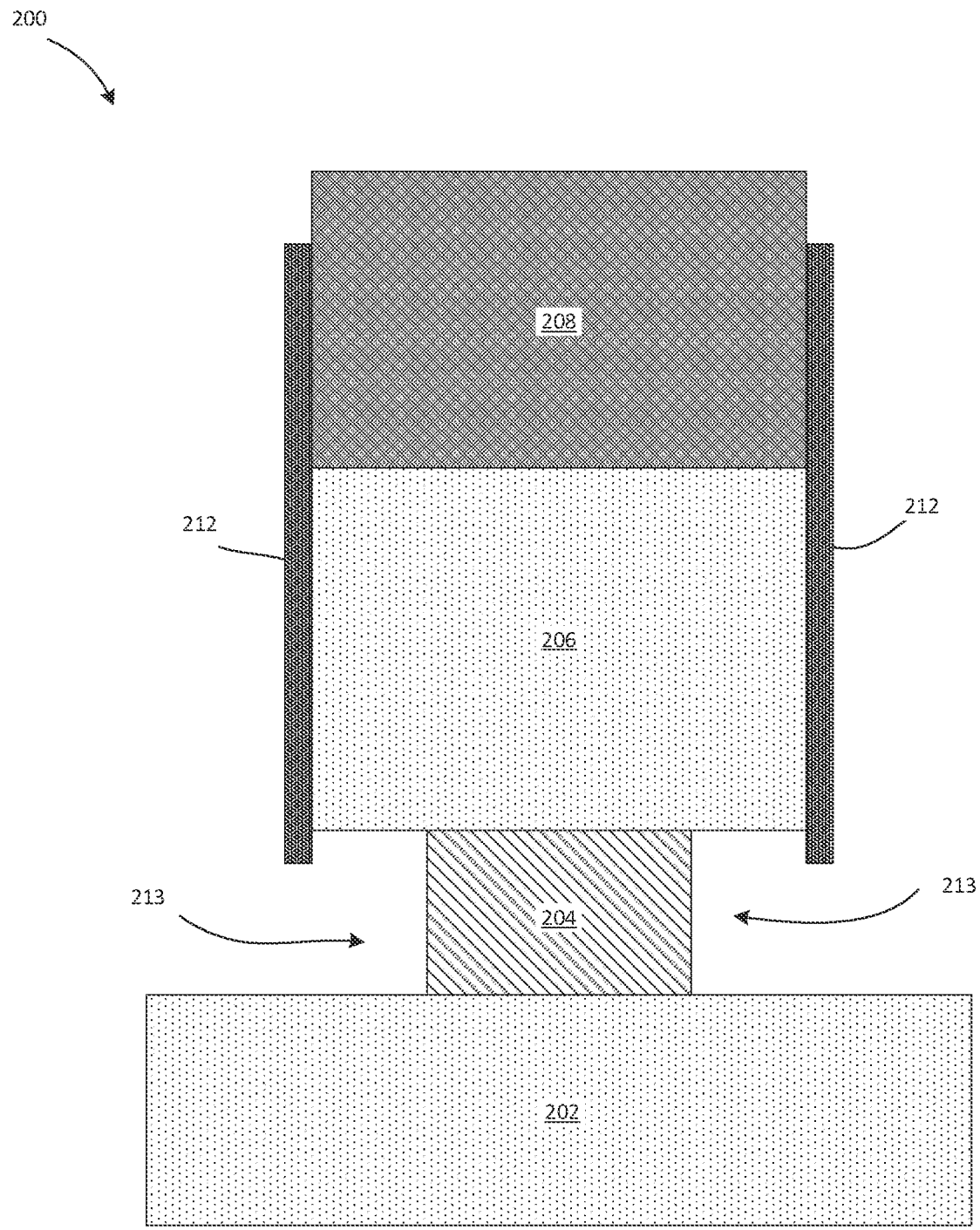
FIG. 12 is a cross-sectional view of the VTFET semiconductor device of FIG. 11 after additional fabrication operations, according to embodiments.

Referring now to FIG. 12, this figure is a cross-sectional view of the VTFET semiconductor device 200 of FIG. 11 after additional fabrication operations, according to embodiments. As shown in FIG. 12, a portion of the SiGe material of the sacrificial layer 204 is removed with any suitable material removal process known to one of skill in the art. Thus, indentations 213 are formed in the sacrificial layer 204. This exposes a portion of the underside of the fin 206, and these exposed portions of the fin 206 serve as nucleation sites for future epitaxial growth.

Figure 13:
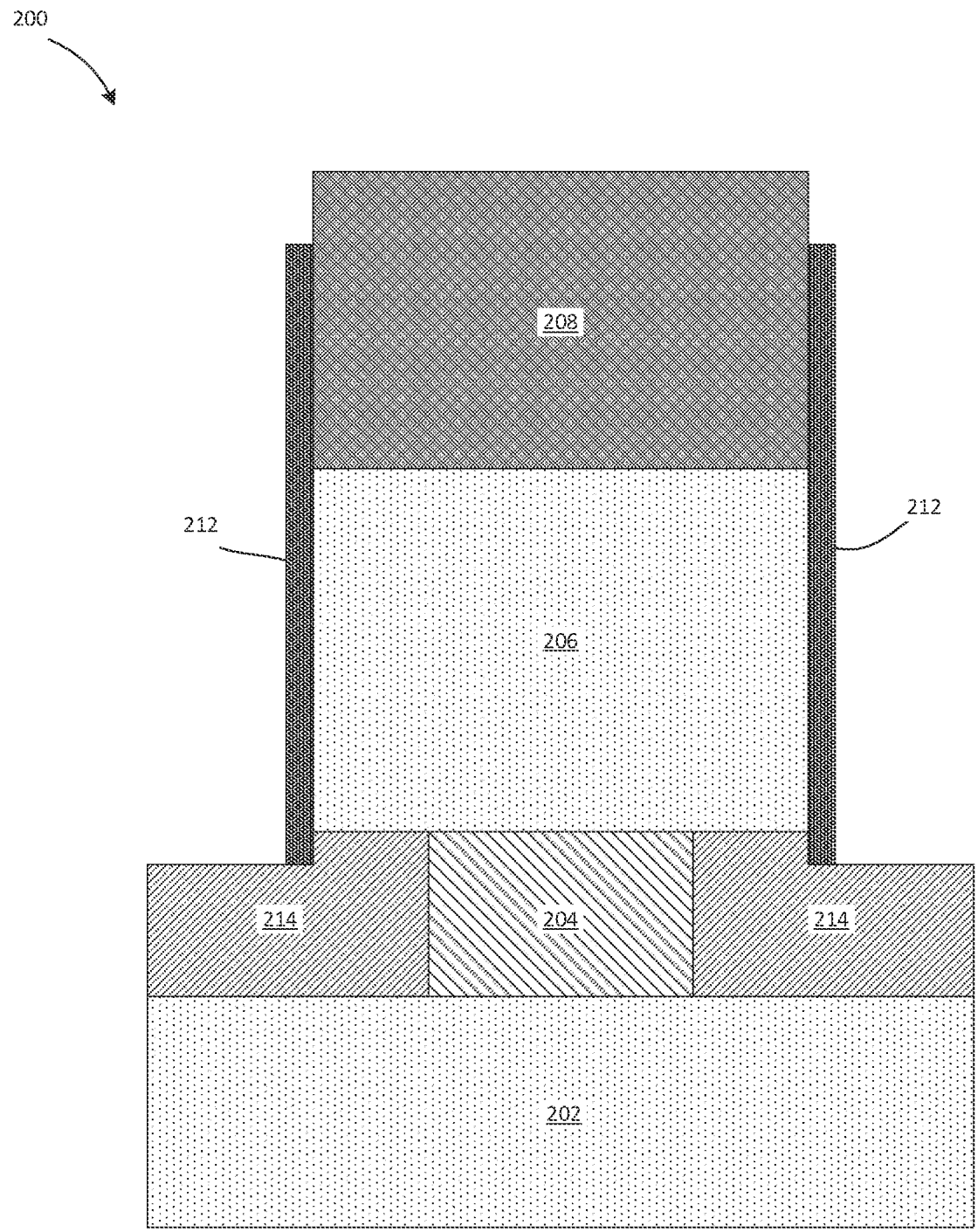
FIG. 13 is a cross-sectional view of the VTFET semiconductor device of FIG. 12 after additional fabrication operations, according to embodiments.

Referring now to FIG. 13, this figure is a cross-sectional view of the VTFET semiconductor device 200 of FIG. 12 after additional fabrication operations, according to embodiments. As shown in FIG. 13, the open portions of the sacrificial layer 204 that were removed by the process described above with respect to FIG. 12 are filled in with an epitaxial layer 214 using the exposed underside of the fin 206 as a nucleation site to begin the epitaxial growth. As shown in FIG. 13, the epitaxial layer 214 fills in the indentations 213 and is grown to a height generally corresponding to the bottom of the sacrificial protective spacer 212. Because the bottom portion of the sacrificial protective spacer 212 extends below the bottom surface of the fin 206, the resulting epitaxial layer 214 has a stepped configuration with outer portions thereof having a height that is somewhat less than inner portions thereof. The epitaxial layer 214 serves as a bottom source/drain region of the VTFET, and it can be doped depends on the type of transistors. For example, a p-type doping material such as boron may be used for the PFET, and an n-type doping material such as phosphorous may be used for the NFET. In certain embodiments, the epitaxial layer 214 is formed discontinuously between the left vertical fin 206 channel and the right vertical fin 206 channel, and separate portions of the bottom S/D epitaxial layer (or epitaxial layer 214) separately contact both the left vertical fin 206 channel and the right vertical fin 206 channel.

Figure 14:
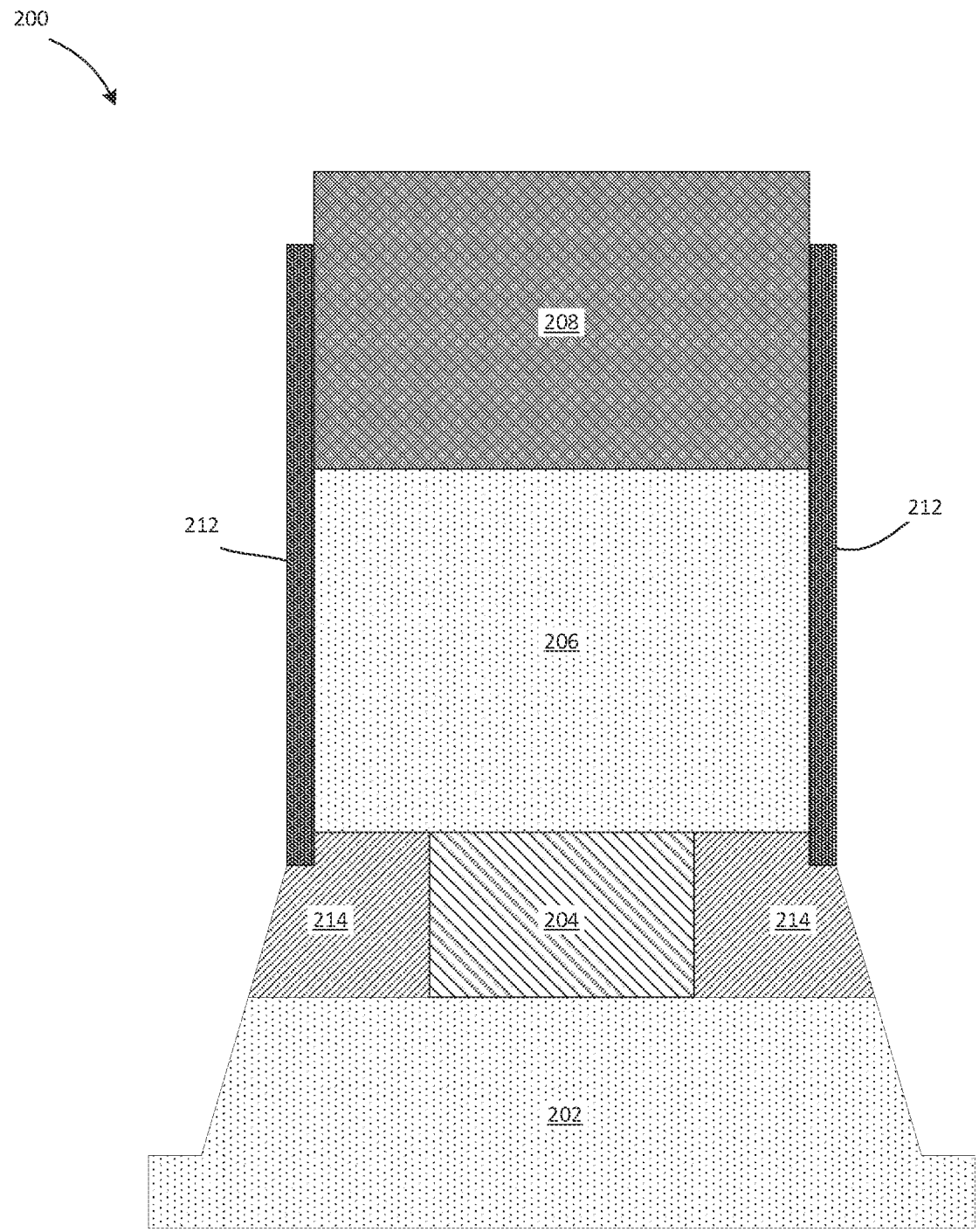
FIG. 14 is a cross-sectional view of the VTFET semiconductor device of FIG. 13 after additional fabrication operations, according to embodiments.

Referring now to FIG. 14, this figure is a cross-sectional view of the VTFET semiconductor device 200 of FIG. 13 after additional fabrication operations, according to embodiments. As shown in FIG. 14, a self-aligned material removal process (e.g., RIE) is performed on the epitaxial layer 214 and the substrate 202 while using the hardmask 208 and the sacrificial protective spacer 212 as a mask. In certain examples, the self-aligned material removal process results in a tapered profile to the sidewalls of the epitaxial layer 214 and the substrate 202.

Figure 15:
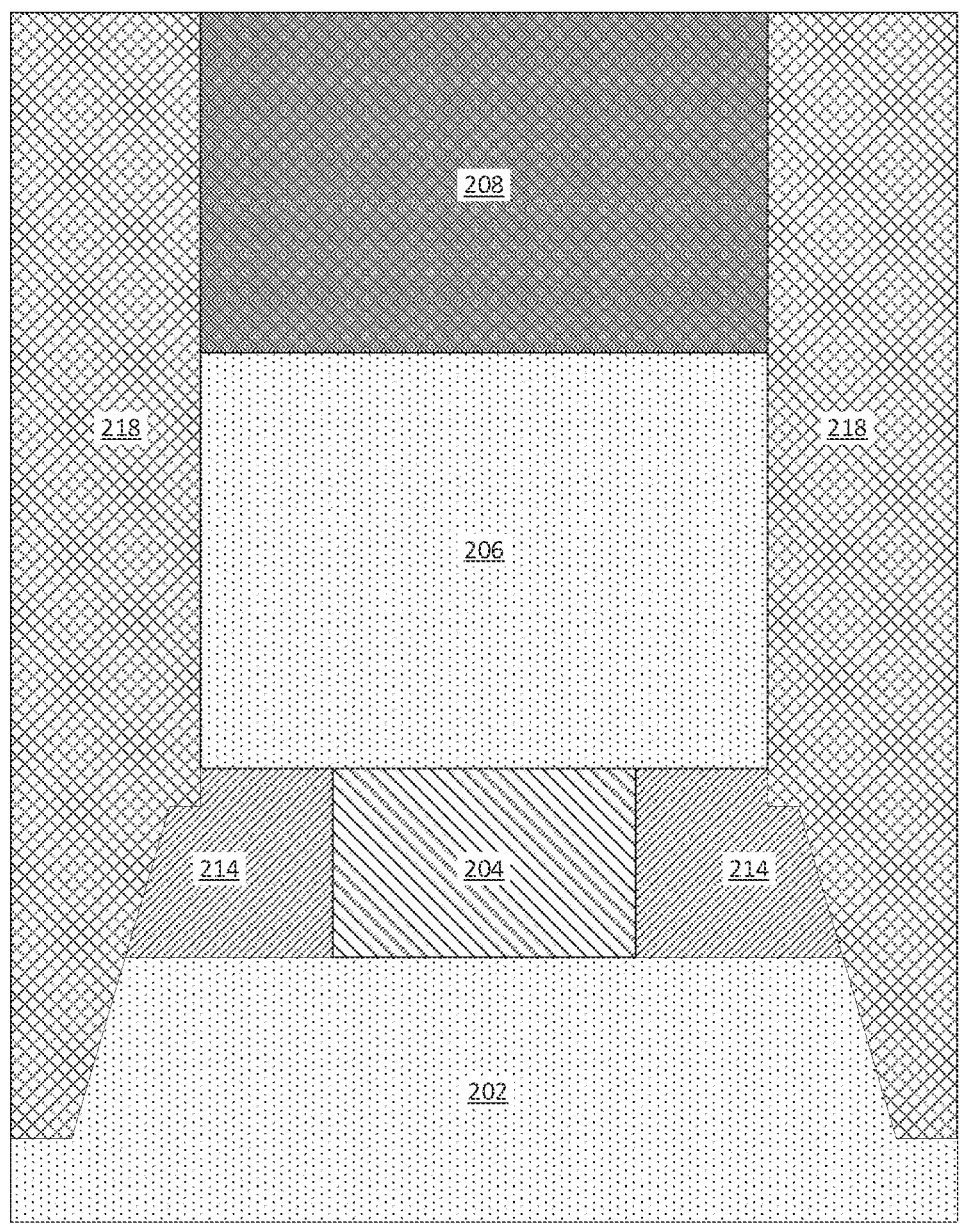
FIG. 15 is a cross-sectional view of the VTFET semiconductor device of FIG. 14 after additional fabrication operations, according to embodiments.

Referring now to FIG. 15, this figure is a cross-sectional view of the VTFET semiconductor device 200 of FIG. 14 after additional fabrication operations, according to embodiments. As shown in FIG. 15, the sacrificial protective spacer 212 is removed and an organic planarization (OPL) layer 218 is formed on the outer sides of the fin 206. The OPL layer 218 may include any suitable insulating OPL material (s). In certain examples, an OPL recess process may be performed on the semiconductor device 200 to reveal the top surface of the hardmask 208.

Figure 16:
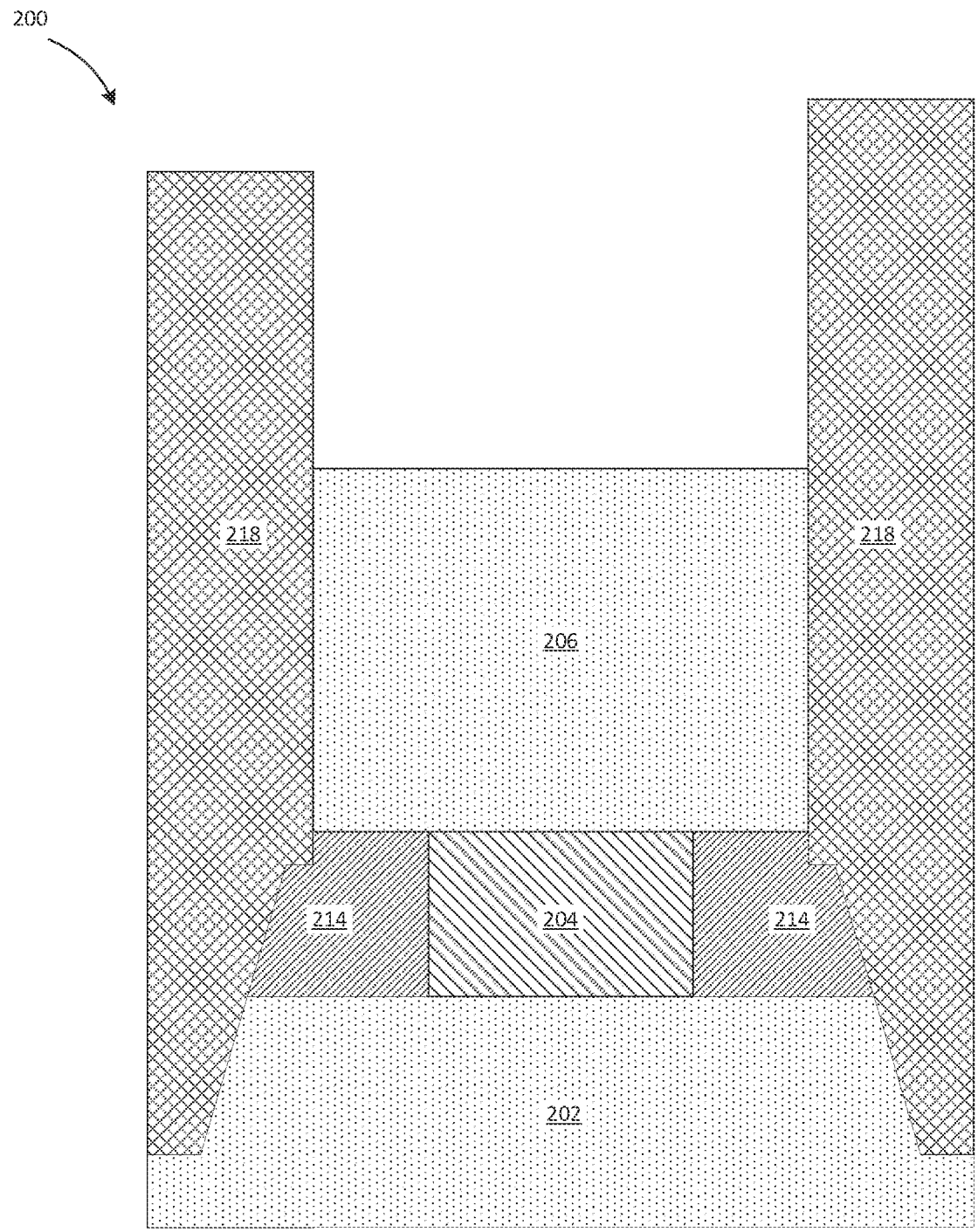
FIG. 16 is a cross-sectional view of the VTFET semiconductor device of FIG. 15 after additional fabrication operations, according to embodiments.

Referring now to FIG. 16, this figure is a cross-sectional view of the VTFET semiconductor device 200 of FIG. 15 after additional fabrication operations, according to embodiments. As shown in FIG. 16, the hardmask 208 is removed by any suitable material removal process known to one in the art. The removal of the hardmask 208 thus exposes an upper surface of the fin 206.

Figure 17:
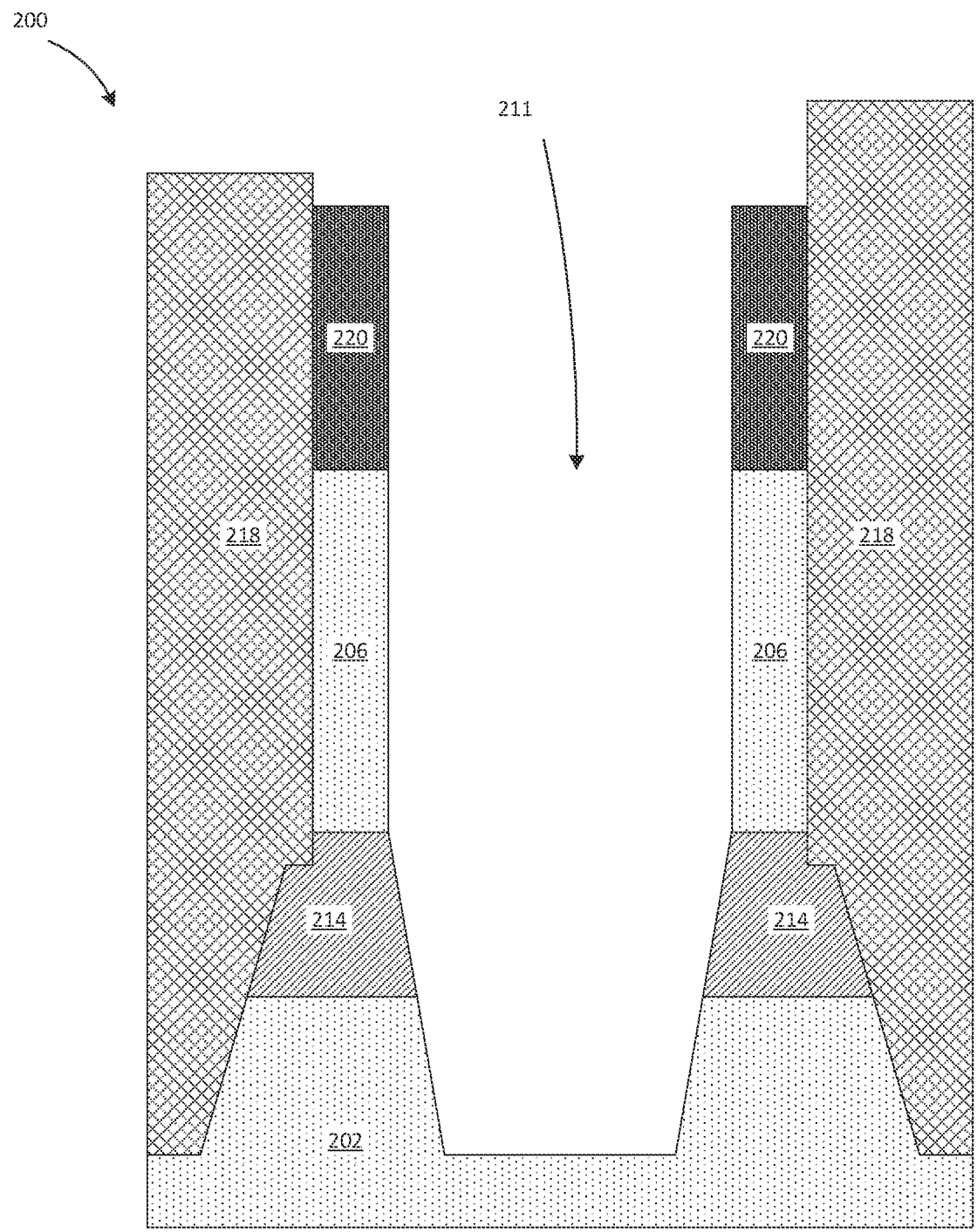
FIG. 17 is a cross-sectional view of the VTFET semiconductor device of FIG. 16 after additional fabrication operations, according to embodiments.

Referring now to FIG. 17, this figure is a cross-sectional view of the VTFET semiconductor device 200 of FIG. 16 after additional fabrication operations, according to embodiments. As shown in FIG. 17, in the opening formed by the removal of the hardmask 208, an inner spacer 220 is formed on the sidewalls of the OPL layer 218 and on the fin 206 layer. Then, using the inner spacer 110 and the OPL layer 218 as a mask, a trench 211 is formed by etching through the fin 206 layer, through the sacrificial layer 204, and through a portion of the substrate 202. As shown in FIG. 17, any remaining portions of the sacrificial layer 204 are removed in this step. However, even if there are any nonuniformities in the etching depth (i.e., due to, for example, an RIE material removal process removing more or less of the substrate 202), the height of the fins 206 remain the same. Moreover, it can be seen that the width of the resulting fins 206 corresponds generally to the width of the inner spacers 220. Moreover, as mentioned above, the height of the fins 206 remains the same as when the original fin 206 layer was formed by the epitaxial process.

Figure 18:
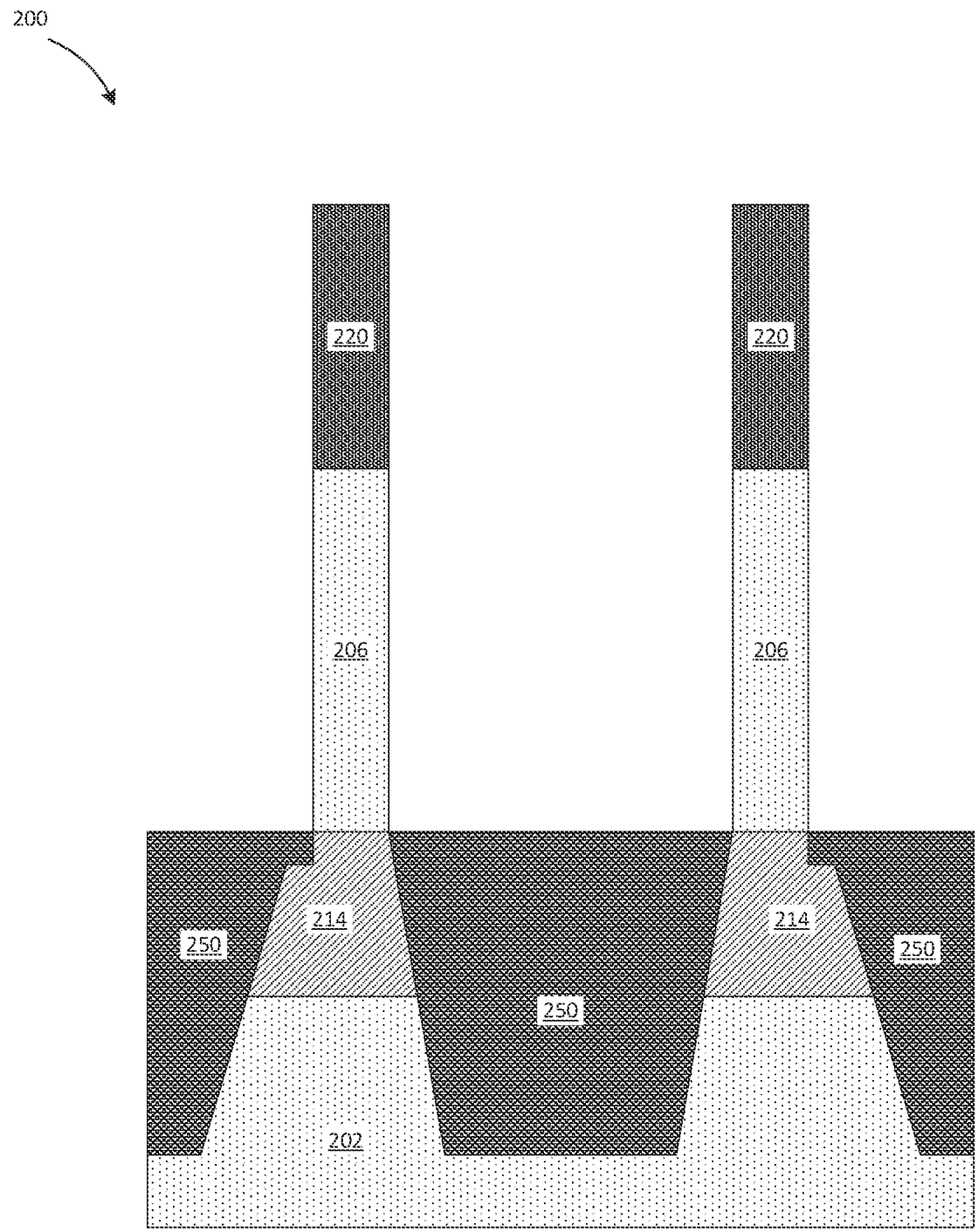
FIG. 18 is a cross-sectional view of the VTFET semiconductor device of FIG. 17 after additional fabrication operations, according to embodiments.

Referring now to FIG. 18, this figure is a cross-sectional view of the VTFET semiconductor device 200 of FIG. 17 after additional fabrication operations, according to embodiments. As shown in FIG. 18, the OPL layer 218 is removed. As also shown in FIG. 18, the semiconductor device 200 also includes isolation regions 250 (e.g., shallow trench isolation (STI) regions) formed in recessed portions of the substrate 202. The isolation regions 250 include dielectric material, such as, but not necessarily limited to, $SiO_x$, SiOC, SiOCN or some other suitable dielectric material.

Thus, in the present embodiment as shown and described above with respect to FIGS. 9-18, the fin 206 height (i.e., due to the original formation of the fin 206 by the epitaxial process) and the fin 206 width (i.e., due to the controlled width of the inner spacer 220) are accurate. Moreover, the location of the epitaxial layer 214 is controlled to be directly under the fins 206. Moreover, the epitaxial layer 214 has an asymmetric kink (or stepped profile in cross-section) which faces toward the outer sides of the two fins 206, and the epitaxial layer 214 has two portions that separately contact the adjacent fins 206.

Although not shown in FIGS. 1-8 or FIGS. 9-18, it should be appreciated that although the focus of the present disclosure relates to the controlled height of the fins and the controlled formation location of the lower epitaxial layer, the VTFET device further includes several additional layers and processing steps to complete the formation of the device, as are readily understood by a person of skill in the art. For example, a bottom spacer is deposited over the bottom S/D epi and STI, after that, a high-κ dielectric layer (not shown) may be deposited over the bottom spacer. Then, a work function metal (WFM) layer (not shown) may be formed on the high-κ dielectric layer. A material of the WFM layer may be, for example, TiN, or any other suitable gate conductor material. Next, a WFM protecting layer (not shown) may be formed on the WFM layer. The WFM protecting layer may be, for example, a nitride layer such as SiN. Thus, a gate stack is formed of the high-κ dielectric layer, the WFM layer and the WFM protection layer. It should be appreciated that the WFM metal patterning process can be done to form different WFM layers for different devices. For example, for a PFET, the WFM can be TiN, and for an NFET, the WFM can be TiAlC, or a combination of multiple layers of TiAlC and TiN. Also, a second organic planarization (OPL) layer (not shown) may be formed over the VTFET semiconductor device 100 or 200. This OPL layer fills in gaps between adjacent fins 106 or 206. The second OPL layer is deposited on the resulting structure and then patterned. After the second OPL layer is coated, an additional litho stack such as anti-reflective coating (ARC) layer (not shown) (such as a low-temperature oxide (LTO) or a silicon-containing anti-reflective coating (SiARC) layer) and a photoresist layer is formed on the ARC layer. A top epitaxial layer may be formed on the fins 106 or 206, and associated metal contacts (not shown) may also be formed to complete the manufacturing of the semiconductor device.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
a vertical transport field-effect transistor (VTFET) device including
a bottom source/drain (S/D) epitaxial layer, and
a vertical fin channel formed on the bottom S/D epitaxial layer,
wherein a first side of the vertical fin channel is aligned with a first side of the bottom S/D epitaxial layer, and
wherein the bottom S/D epitaxial layer has a stepped cross-sectional profile including an upper portion in contact with the vertical fin channel and a topmost surface of the upper portion of the bottom S/D epitaxial layer having a width that is greater than a width of the vertical fin channel.

2. The semiconductor device of claim 1, the VTFET device further comprising a second vertical fin channel formed on the bottom S/D epitaxial layer.

3. The semiconductor device of claim 2, wherein the bottom S/D epitaxial layer is formed continuously between the vertical fin channel and the second vertical fin channel and contacts both the vertical fin channel and the second vertical fin channel.

4. The semiconductor device of claim 2, wherein the bottom S/D epitaxial layer is formed discontinuously between the vertical fin channel and the second vertical fin channel, and separate portions of the bottom S/D epitaxial layer separately contact both the vertical fin channel and the second vertical fin channel.

5. The semiconductor device of claim 2, wherein a first side of the second vertical fin channel is aligned with a second side of the bottom S/D epitaxial layer, and the stepped profile of the bottom S/D epitaxial layer also extends beyond a second side of the second vertical fin channel.

6. The semiconductor device of claim 1, wherein the bottom S/D epitaxial layer is directly located under the vertical fin channel.

7. The semiconductor device of claim 1, wherein a first portion of the bottom S/D epitaxial region directly under the vertical fin channel has a first height, and a second portion of the bottom S/D epitaxial region that is not directly under the vertical fin channel has a second height, and the first height is greater than the second height.

8. The semiconductor device of claim 1, further comprising an inner spacer on the vertical fin channel.

9. The semiconductor device of claim 8, wherein a width of the inner spacer is the same as a width of the vertical fin channel.

10. The semiconductor device of claim 1, further comprising shallow trench isolation (STI) regions formed on sides of the bottom S/D epitaxial region.

11. A method of manufacturing a semiconductor device, the method comprising:
forming a vertical transport field-effect transistor (VT-FET) device, the forming including
forming a bottom source/drain (S/D) epitaxial layer,
forming a vertical fin channel on the bottom S/D epitaxial layer, and
forming a top S/D epitaxial layer on the vertical fin channel,
wherein a first side of the vertical fin channel is aligned with a first side of the bottom S/D epitaxial layer, and
wherein the bottom S/D epitaxial layer has a stepped cross-sectional profile including an upper portion in contact with the vertical fin channel and a topmost surface of the upper portion of the bottom S/D epitaxial layer having a width that is greater than a width of the vertical fin channel.

12. The method of claim 11, further comprising forming a second vertical fin channel on the bottom S/D epitaxial layer.

13. The method of claim 12, wherein the bottom S/D epitaxial layer is formed continuously between the vertical fin channel and the second vertical fin channel and contacts both the vertical fin channel and the second vertical fin channel.

14. The method of claim 12, wherein the bottom S/D epitaxial layer is formed discontinuously between the vertical fin channel and the second vertical fin channel, and separate portions of the bottom S/D epitaxial layer separately contact both the vertical fin channel and the second vertical fin channel.

15. The method of claim 12, wherein a first side of the second vertical fin channel is aligned with a second side of the bottom S/D epitaxial layer, and the stepped profile of the bottom S/D epitaxial layer also extends beyond a second side of the second vertical fin channel.

16. The method of claim 11, wherein the bottom S/D epitaxial layer is directly located under the vertical fin channel.

17. The method of claim 11, wherein a first portion of the bottom S/D epitaxial region directly under the vertical fin channel has a first height, and a second portion of the bottom S/D epitaxial region that is not directly under the vertical fin channel has a second height, and the first height is greater than the second height.

18. The method of claim 11, further comprising forming an inner spacer on the vertical fin channel.

19. The method of claim 18, wherein a width of the inner spacer is the same as a width of the vertical fin channel.

20. The method of claim 11, further comprising forming shallow trench isolation (STI) regions on sides of the bottom S/D epitaxial region.

* * * * *